United States Patent [19]

Bose

[11] Patent Number: 5,304,031
[45] Date of Patent: Apr. 19, 1994

[54] OUTER AIR SEAL FOR A GAS TURBINE ENGINE

[75] Inventor: Sudhangshu Bose, Manchester, Conn.

[73] Assignee: The United States of America as represented by the Secretary of the Air Force, Washington, D.C.

[21] Appl. No.: 28,771

[22] Filed: Feb. 25, 1993

[51] Int. Cl.⁵ .............................................. F01D 11/08
[52] U.S. Cl. .................. 415/173.4; 415/200; 277/233; 277/DIG. 6; 428/457; 428/698
[58] Field of Search .............. 415/170.1, 173.1, 173.4, 415/174.4, 200; 416/229 A, 241 B; 277/53, 233, DIG. 6; 428/457, 698

[56] References Cited

U.S. PATENT DOCUMENTS

| | | |
|---|---|---|
| 4,209,334 | 6/1980 | Panzera . |
| 4,289,446 | 9/1981 | Wallace . |
| 4,338,380 | 7/1982 | Erickson et al. . |
| 4,492,522 | 1/1985 | Rossman et al. ................ 416/229 A |
| 4,626,461 | 12/1986 | Prewo et al. . |
| 4,704,332 | 11/1987 | Brennan et al. . |
| 4,738,902 | 4/1988 | Prewo et al. . |
| 4,801,510 | 1/1989 | Mehrotra et al. ..................... 428/698 |
| 4,824,711 | 4/1989 | Cagliostro et al. .................. 428/698 |
| 5,211,999 | 5/1993 | Okada ................................. 428/698 |

FOREIGN PATENT DOCUMENTS 2054257  4/1992  Canada ............................... 428/698

Primary Examiner—Richard A. Bertsch
Assistant Examiner—Christopher M. Verdier
Attorney, Agent, or Firm—Donald J. Singer; Irwin P. Garfinkle

[57] ABSTRACT

An uncooled turbine outer air is comprised of a combination of monolithic ceramics with high temperature capability and oxidation and creep resistance, and a fiber reinforced ceramic composite with high fracture toughness. In a preferred embodiment of the invention, a fiber reinforced ceramic composite of silicon carbide and aluminum borosilicate is infiltrated by chemically vapor deposited silicon carbide. The infiltration process is continued until the composite develops a monolithic layer of silicon carbide. An additional layer is deposited on the monolithic ceramic to provide additional thermal protection.

16 Claims, 1 Drawing Sheet

OUTER AIR SEAL FOR A GAS TURBINE ENGINE

STATEMENT OF GOVERNMENT INTEREST

The invention described herein may be manufactured and used by or for the Government for governmental purposes without the payment of any royalty thereon.

FIELD OF THE INVENTION

This invention relates to a seal used in gas turbine engines, and more particularly to an uncooled turbine outer air seal. The seal is comprised of a combination of monolithic ceramics with high temperature capability and oxidation and creep resistance, and a fiber reinforced ceramic composite with high fracture toughness. In a preferred embodiment of the invention, a fiber reinforced ceramic composite of silicon carbide or aluminum borosilicate is infiltrated by chemically vapor deposited silicon carbide. The infiltration process is continued until the composite develops a monolithic layer of silicon carbide. An additional layer is deposited on the monolithic ceramic to provide additional thermal protection.

BACKGROUND OF THE INVENTION

Uncooled turbine outer air seals with only incidental cooling from leakage air can provide substantial saving in terms of percent of thrust specific fuel consumption (TSFC) in many gas turbine engines such as the Pratt and Whitney PW2037, PW4000 and 2500. However, the aggressive thermal environment of uncooled seals precludes the use of all metal or graded zirconia based seals. Advance ceramic materials are appropriate for such applications, except for the fact that monolithic ceramics, due to their low fracture toughness, are prone to catastrophic failure as a result of bill of material damage (BOMD). This invention overcomes such possibilities by providing a combination of monolithic ceramic with high temperature capability (in the range of 2500 to 3000 degrees F.), oxidation and creep resistance, and a fiber reinforced ceramic composite with high fracture toughness.

A search of the prior art resulted in the following U.S. Patents relating to high temperature composite seals:

U.S. Pat. No. 4,738,902 issued to Prewo et. al.;
U.S. Pat. No. 4,704,332 issued to Brennan et. al.;
U.S. Pat. No. 4,626,461 issued to Prewo et. al.;
U.S. Pat. No. 4,338,380 issued to Erickson et. al.;
U.S. Pat. No. 4,289,446 issued to Wallace; and
U.S. Pat. No. 4,209,334 issued to Panzera These patents relate to high temperature composite seals. In particular, the Prewo et. al. '902 patent is directed to gas turbine engine core components made of silicon carbide fiber reinforced ceramic matrix or silicon carbide fiber reinforced glass matrix material. Several techniques for making the components are described including drawing a continuous length of reinforcing fiber through a slurry of glass powder mixed with a liquid binder, drying the impregnated fibers in the form of a tape or a drum, laying up the resulting fiber tape into a predetermined shape and then hot pressing it into its final form. Another technique comprises preparing a mixture of glass powder and chopped fibers at elevated temperatures and then hot pressing into the final product.

The Brennen et. al. patent describes a seal composed of an abradable sealing layer affixed to a high temperature stable substrate. The abradable sealing layer includes a high temperature stable ceramic oxide, and the substrate is a high temperature stable, lightweight, fiber reinforced glass or glass ceramic having a relatively low coefficient of thermal expansion.

The Prewo et. al. '461 patent relates to gas turbine engine components which comprise a plurality of substantially titanium-free ceramic layers selected from alumino-silicate, lithium alumino-silicate, magnesium alumino-silicate or mixtures thereof. Each layer is reinforced with a plurality of unidirectional, continuous length silicon carbide fibers.

The Erickson et. al. patent describes a method of attaching ceramics to metals for high temperature usage. The method comprises a ceramic layer; a three dimensional flexible, resilient, low modulus, low density, metallic structure interface secured to the ceramic layer; and a metal member fastened to the low modulus metallic structure. Thermal strains caused by differences in the coefficients of thermal expansion of the metal member and ceramic are absorbed by the low modulus material interface.

The Wallace patent is directed to an outer air seal structure for gas turbine engines. The structure is built around a porous, low modulus pad of metallic material which is disposed between ceramic material and a substrate of solid metallic material. The ceramic material is applied to a preferred density at which the physical properties of modulus of elasticity, mean tensile strength, coefficient of thermal expansion and thermal conductivity impart good thermal shock resistance.

The Panzera patent is directed to a ceramic seal comprising an inner ceramic layer, an outer metal layer and an intermediate interface layer of a low modulus metallic low density structure having a high melting point. The ceramic layer is secured to the low modulus structure directly or through an intermediate ceramic-metal composite.

Although the foregoing patents relate to various designs of ceramic seals, they do not teach a seal in which a fiber reinforced ceramic composite of silicon carbide and aluminum borosilicate is infiltrated by chemically vapor deposited silicon carbide to provide thermal protection.

SUMMARY OF THE INVENTION

This invention is for a seal comprised of a combination of monolithic ceramics with high temperature capability and oxidation and creep resistance, and a fiber reinforced ceramic composite with high fracture toughness. In a preferred embodiment of the invention, a fiber reinforced ceramic composite of silicon carbide or aluminum borosilicate is infiltrated by chemically vapor deposited silicon carbide (See Encyclopedia of Chemical Technology, Third Edition, 1982, Vol 20, pp. 47,48). The infiltration process is continued until the composite develops a monolithic layer of silicon carbide. An additional layer is deposited on the monolithic ceramic to provide additional thermal protection.

OBJECTS OF THE INVENTION

It is an object of this invention to provide an uncooled seal which can withstand the severe temperature conditions in modern gas turbine engines.

Another object of this invention is to provide a seal which is a combination of a monolithic ceramic with high temperature capability, oxidation and creep resistance, and a fiber reinforced ceramic composite with high fracture toughness.

Still another object of this invention is to provide a seal which is a combination of a monolithic ceramic with high temperature capability, oxidation and creep resistance, and a fiber reinforced ceramic composite with high fracture toughness, said monolithic ceramic comprising refractory fibers infiltrated by chemically vapor deposited SiC.

Yet another object of this invention is to provide a monolithic ceramic in combination with a fiber reinforced ceramic.

BRIEF DESCRIPTION OF THE DRAWING

These and other advantages, objects and features of the invention will become more apparent after considering the following description taken in conjunction with the illustrative embodiment in the accompanying drawing in which the single

DESCRIPTION OF THE ILLUSTRATED EMBODIMENT

Figure 1:
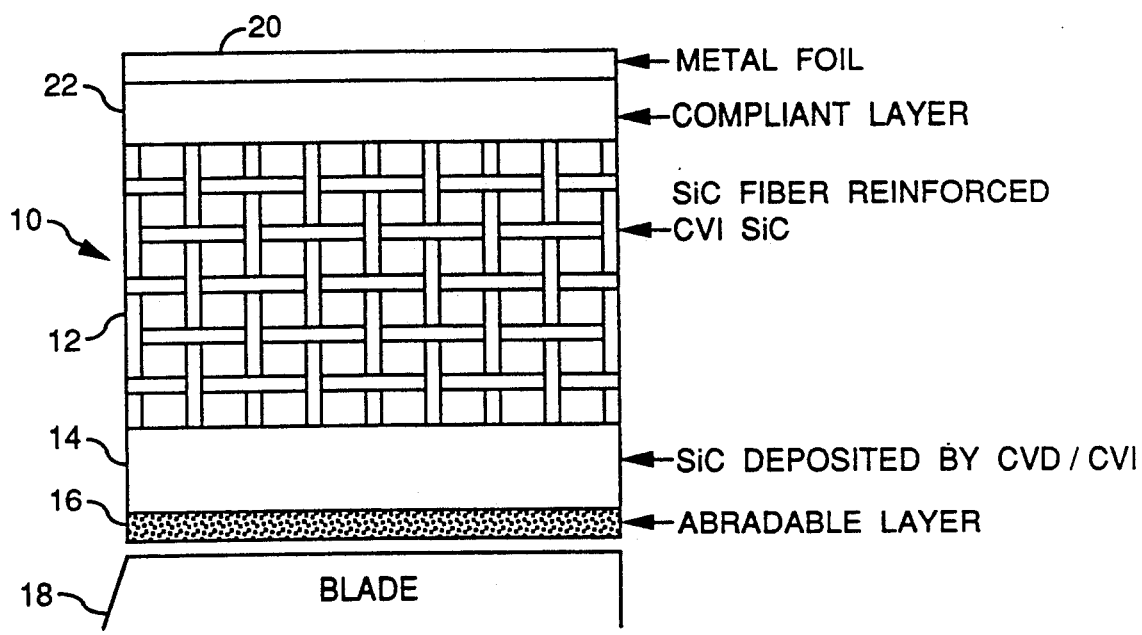
FIG. 1 illustrates a typical embodiment of the invention.

A typical seal built in accordance with this invention is illustrated in the single Figure. As shown a seal 12 comprises a Silicon carbide fiber reinforced layer 12, which is infiltrated by chemical vapor deposition or infiltration to provide a monolithic layer 14 of SiC. The layer 12 is a fiber reinforced ceramic composite using SiC, aluminum borosilicate or other suitable refractory fibers, and it is infiltrated by chemically vapor deposited SiC. The ceramic material has a high temperature capability in the range of from 2500 to 3000 degrees Fahrenheit, and is oxidation and creep resistant. The infiltration process is extended until the composite layer 12 develops a monolithic layer 14 of SiC. The composite matrix is not limited to CiC, nor is the deposition process limited to chemical vapor infiltration.

To provide abradability for the seal 10, an additional layer 16 of suitable composition is deposited on the monolithic layer 14. The monolithic layer 14 and the abradable layer 16 face the high temperature of the turbine blade 18. The entire seal 10 is attached to metal structure 20 of the engine by means of a compliant ceramic layer 22 which is needed to take care of thermal mismatch strain.

Thus, this invention overcomes certain deficiencies of the prior art by providing a combination of a monolithic ceramic with high temperature capability, oxidation and creep resistance, and a fiber reinforced ceramic composite with high fracture toughness.

What is claimed is:

1. An uncooled seal for high temperature turbine blades of a gas turbine engine, said seal comprising:
a composite layer comprising a ceramic material reinforced with refractory fibers; and
a monolithic layer of said ceramic material chemically deposited on said composite layer; and
an abradable layer on said monolithic layer, said abradable layer being located for contact with said turbine blades during the operation of said gas turbine engine.

2. The seal of claim 1 and further comprising a compliant layer of said composite, said compliant layer being located for attachment to a structure of said engine.

3. The seal of claim 1 wherein said ceramic material is silicon carbide, and is deposited on said composite layer by chemical vapor deposition.

4. The seal of claim 1 wherein said ceramic material is aluminum borosilicate and is deposited on said composite layer by chemical vapor deposition.

5. The seal of claim 1 wherein said ceramic material is silicon carbide and is deposited on said first layer by chemical vapor infiltration.

6. The seal of claim 1 wherein said ceramic material is aluminum borosilicate and is deposited on said composite layer by chemical vapor infiltration.

7. The seal of claim 2 wherein said ceramic material is silicon carbide, and is deposited on said composite layer by chemical vapor deposition.

8. The seal of claim 2 wherein said ceramic material is aluminum borosilicate and is deposited on said composite layer by chemical vapor deposition.

9. The seal of claim 2 wherein said ceramic material is silicon carbide and is deposited on said first layer by chemical vapor infiltration.

10. The seal of claim 2 wherein said ceramic material is aluminum borosilicate and is deposited on said composite layer by chemical vapor infiltration.

11. An uncooled seal for high temperature turbine blades of a gas turbine engine, said seal comprising:
a composite layer comprising a ceramic material reinforced with refractory fibers;
a monolithic layer of said ceramic material chemically deposited on said composite layer; and
a compliant layer of said composite, said compliant layer being located on said composite layer for attachment to a structure of said engine.

12. The seal of claim 11 wherein said ceramic material has high temperature capability in the range of from 2500 to 3000 degrees F., and is oxidation and creep resistant.

13. The seal of claim 12 wherein said ceramic material is silicon carbide, and is deposited on said composite layer by chemical vapor deposition.

14. The seal of claim 12 wherein said ceramic material is aluminum borosilicate and is deposited on said composite layer by chemical vapor deposition.

15. The seal of claim 12 wherein said ceramic material is silicon carbide and is deposited on said first layer by chemical vapor infiltration.

16. The seal of claim 12 wherein said ceramic material is aluminum borosilicate and is deposited on said composite layer by chemical vapor infiltration.

* * * * *